DIELECTRIC FILMS FOR SEMICONDUCTOR DEVICES

Filed April 18, 1968 2 Sheets-Sheet 1

INVENTOR
M. J. RAND
BY [signature]
ATTORNEY

United States Patent Office 3,558,348
Patented Jan. 26, 1971

3,558,348

DIELECTRIC FILMS FOR SEMICONDUCTOR DEVICES

Myron J. Rand, Bethlehem, Pa., assignor to Bell Telephone Laboratories, Incorporated, Murray Hill and Berkeley Heights, N.J., a corporation of New York Filed Apr. 18, 1968, Ser. No. 722,336
Int. Cl. H01l 1/02
U.S. Cl. 117—106 3 Claims

ABSTRACT OF THE DISCLOSURE

Mixed silicon oxide-silicon nitride films of particular compositions are vapor deposited controllably on semiconductor devices by a reaction process in nitrogen at between 700–900° C. using silane ($SiH_4$) and nitric oxide (NO) as the reactants. The composition of the deposited film is a function of the ratio of reactant concentrations. Particular compositions yield films which combine minimal stress, resistance to penetration of contaminants, and etchability.

BACKGROUND OF THE INVENTION

Dielectric films are commonly used on semiconductor surfaces for diffusion masking, surface passivation, and as insulating layers. Typically, such films are vapor deposited except in the case of silicon oxide which also may be thermally grown on silicon surfaces. Silicon dioxide, first use as diffusion mask, has proven inadequate under certain circumstances as a protective coating. Consequently, films of silicon nitride and aluminum-oxide have been used in combination with silicon dioxide to improve surface passivation.

However, the use of these films alone, or in combination, introduces other difficulties. Silicon dioxide films on silicon, generally, are under compressive stress at room temperature as a consequence of the mismatch in thermal coefficients. Silicon nitride films, on the other hand, are under tensile stress, as are films of aluminum oxide. The consequences of such stress are film cracking, especially at edges and mask windows, and the bending of thin substrates by the induced strains. Such stress also may cause slip in the substrate crystal or surface dislocations.

Moreover, silicon nitride and aluminum oxide require a different etching technology than silicon oxide thus complicating the fabrication procedures which involve diffusion and contact masking and etching.

Accordingly, an object of this invention is a film for a semiconductor device surface having good dielectric strength, passivation properties, and etchability combined with low mechanical stress.

SUMMARY OF THE INVENTION

In accordance with one example of this invention, a chemical vapor deposition process enables simple and reproducible preparation of films of mixed composition of silicon dioxide and silicon nitride, hereinafter referred to as oxynitrides. In this process, silicon hydride ($SiH_4$), known as silane, and nitric oxide (NO) are reacted in a gaseous ambient at an elevated temperature, typically between about 600 and 900° C. in the presence of the substrate being coated. The composition of the deposited film depends upon the ratio of the reactant concentrations. Within the range of the various ratios of nitric oxide to silane, two compositions, specifically, are of particular interest, namely those formed where the reactant ratios are twenty and three. The former value produces a film of apparently minimum stress on silicon and the latter ratio, three, although providing somewhat higher stress, results in a film combining an advantageously low stress with very good passivation characteristics along with etching compatibility. This latter composition is very close to the compound $Si_3O_4N_2$.

Accordingly, a feature of this invention is a process for forming useful films on semiconductor surfaces which employs the same general equipment and techniques used for making the pure compound films.

DESCRIPTION OF THE DRAWING

The invention and its other objects and features will be more clearly understood from the following detailed description taken in conjunction with the drawing in which.

DETAILED DESCRIPTION

In the process in accordance with this invention, silane ($SiH_4$) and nitric oxide (NO) are reacted in a nitrogen ambient at temperatures between about 600 and 900° C. In a specific example, a slice of monocrystalline silicon simiconductor material having a polished <111> surface was mounted on a graphite pedestal in a vertical tube reaction chamber. The pedestal was heated using a cylindrical radio-frequency coil and the reactant compounds were introduced into the reaction at low concentrations in nitrogen. Other suitable carrier gases include hydrogen, argon, neon and helium. Typically, the duration of a deposition run was determined by the admission of the silane.

In a particular embodiment, silane ($SiH_4$) was supplied at a level of 3% by volume in nitrogen and nitric oxide (NO) as 4% in nitrogen. According to the reactant ratio selected however, the concentrations in the reactor are lower, specifically, in the range of 0.01% to 2% for the nitric oxide and 0.01% to 0.12% for the silane. Total gas flow through the deposition or reaction chamber was about three liters per minute, corresponding to a linear velocity of about seven centimeters per second. Generally, the process was conducted at temperatures of 700° C. or 850° C., the higher temperature yielding a somewhat higher deposition rate.

The important control parameter in this process is the molar ratio of the two reactants nitric oxide (NO) and silane ($SiH_4$) in the mixture admitted to the reaction chamber. This ratio. $NO/SiH_4$, primarily determines the composition of the deposited oxynitride film and also affects, to some degree, the depositoin rate. Referring to the three component phase diagram of FIG. 1, there are shown a series of points identified by numbers indicating the reactant ratio used to produce the particular composition plotted. At the large ratio, $NO/SiH_4=100$, the film is substantially silicon dioxide. As the ratio is reduced from thirty to three and below, more and more nitrogen is incorporated into the film.However, below a ratio of unity the nitrogen content increases very slowly.

It is postulated that the reaction proceeds by way of a complex free-radical mechanism. Four probable overall reactions may be written in order of increasing $NO/SiH_4$ ratio as follows:

$$SiH_4 \rightarrow Si+2H_2$$
$$4NO+5SiH_4 \rightarrow Si_3H_4+2SiO_2+10H_2$$
$$NO+SiH_4 \rightarrow SiON+2H_2$$
$$2NO+SiH_4 \rightarrow SiO_2+N_2+2H_2$$

Figure 1:
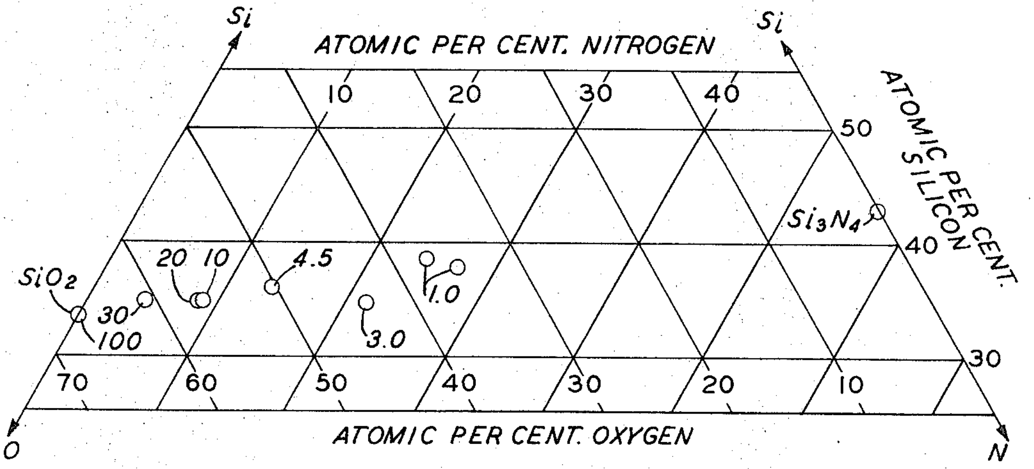
FIG. 1 is a three component phase diagram indicating the composition of certain oxynitride films produced by the process of this invention.

All of the films indicated by the compositions plotted in the diagram of FIG. 1, ranging from a ratio of one to a ratio of one hundred, were clear, vitreous, hard and adherent. As determined by electron diffraction, the films were amorphous, with a degree of ordering estimated to be equal or less than that shown by thermally-grown (steam) silicon dioxide.

Figure 2:
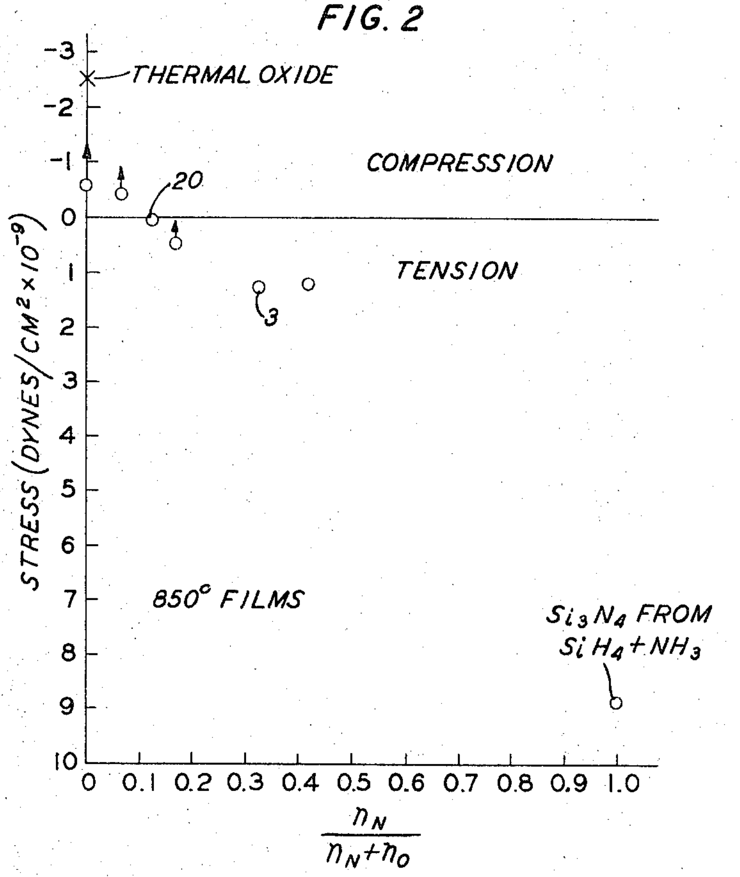
FIG. 2 is a graph of average film stress ploted against film composition for certain oxynitride films.

Two compositions are of particular interest with respect to semiconductor device fabrication. They are produced by reactant ratios of twenty and three. The composition based on the ratios of twenty has a composition in atomic percentage of 34% silicon, 8½% nitrogen and 57½% oxygen. Referring to the graph of FIG. 2 the nominally zero average stress present in this composition film where applied on silicon is indicated by the point similarly identified by the numeral 20. Thus, a film of this particular composition is ideal where a thick insulating layer is required, or where a fragile silicon substrate is used which cannot tolerate distortion from differential thermal effects, for example, during cooling from processing temperatures.

The average stress present in the other composition of particular interest is indicated by the point denoted by the numeral 3. As indicated by its location on the diagram, this composition, when compared to silicon nitride, is under relatively small average stress, specifically tension. However, this particular composition exhibits other particular properties which make it very advantageous.

Figure 3:
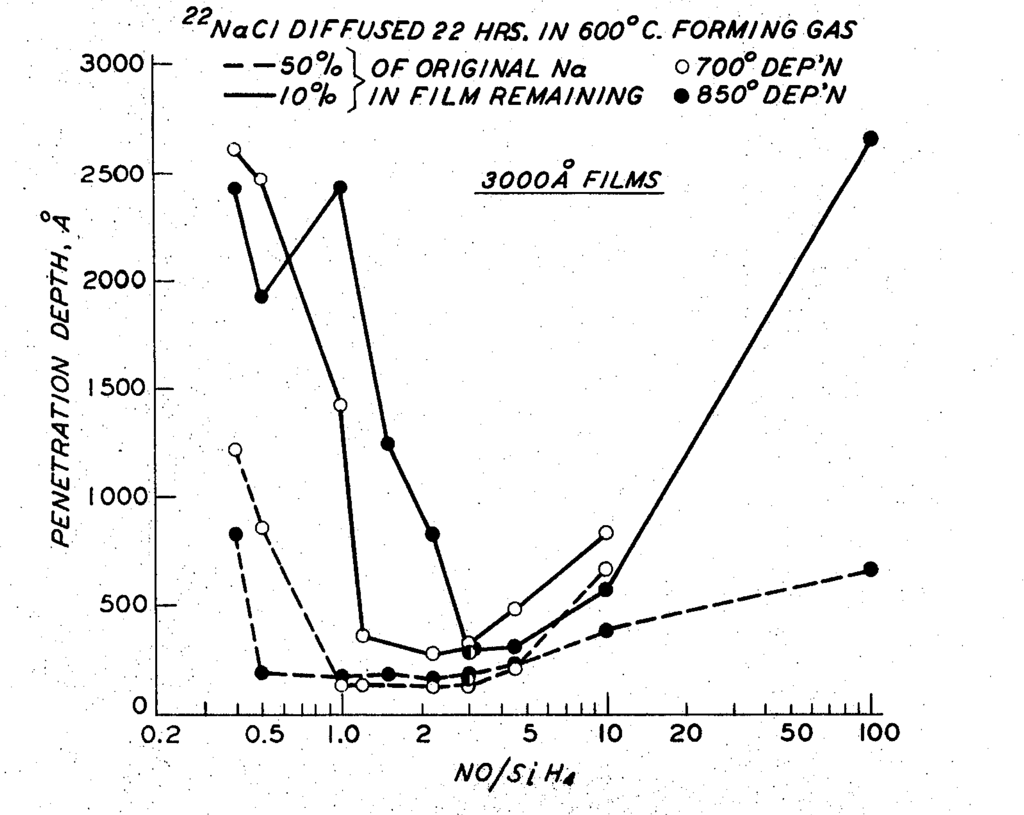
FIG. 3 is a graph indicating the results of sodium ion barrier tests for various oxynitride composition.

FIG. 3 illustrates one particularly advantageous property of the $NO/SiH_4=3$ film. This graph shows the results of tests to determine the degree of penetration of sodium ions, which are known to be a prime factor in the electrical degradation of semiconductor device surfaces. In FIG. 3 film composition is abscissa and ordinate is the thickness of film which must be removed to reduce an original sodium content, after diffusion and rinsing, to 50% and to 10%. The existence of a definite minimum near the $NO/SiH_4=3$ film is apparent. Although this particular film ($Si_3O_4N_2$) is not so good a sodium barrier as pure silicon nitride it is reasonably effective, the best of the mixed composition films, far better than silicon dioxide, and exhibits an average stress only about 15% that of pure silicon nitride. Thus, thicker films of this composition may be used without incurring any substantial effects of stress.

Figure 4:
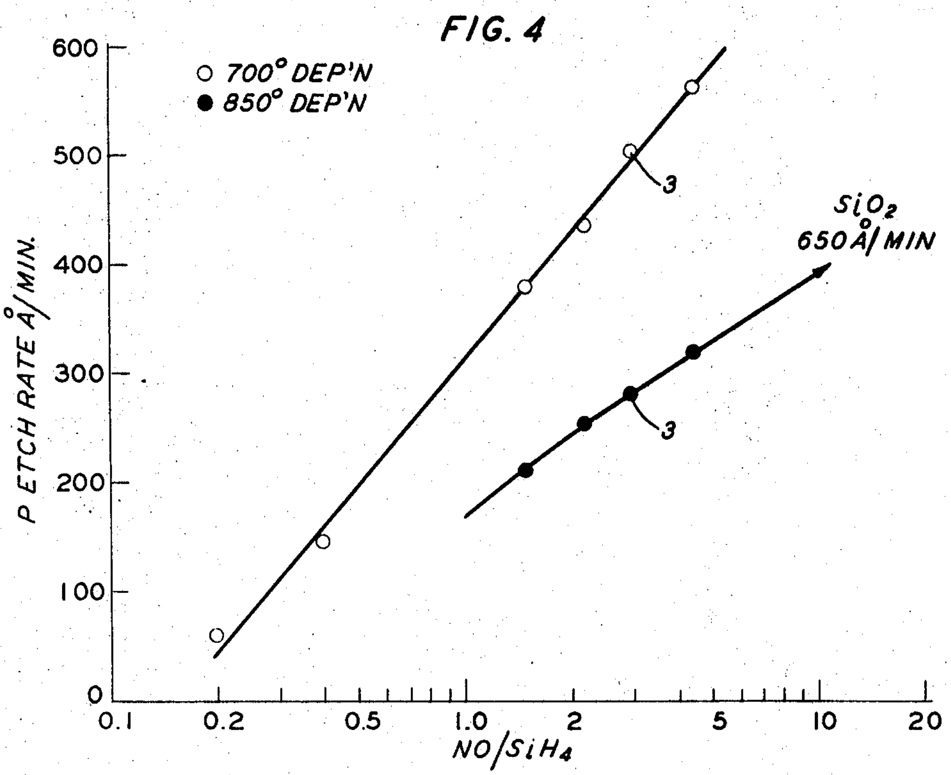
FIG. 4 is a graph showing etch rates for various oxynitride compositions in a particular hydrofluoric acid and nitric acid etchant solution.

Moreover, there is a further advantage in the use of the oxynitrides as compared to configurations involving silicon nitride which is illustrated in the graph of FIG. 4. This diagram plots the etch rate of film against composition, one curve depicting a deposition at 700° C. and the other at 850° C. The particular etchant (P), comprises the following proportions, by volume: Hydrofluoric acid —15, nitric acid —10, and water —300, with the acids being at concentrated levels. Thus, the plot of FIG. 3 indicates the susceptibility of the $NO/SiH_4=3$ film to a relatively common etching solution and at a respectable rate of attack. Furthermore, the etch rate for the 850° C. deposited film of $NO/SiH_4=3$ has an etch rate in common etchants of the hydrofluoric acid type which is about 2½ times that of steam grown silicon oxide in the same etchant.

The oxynitride films referred to in connection with the foregoing described process may be deposited at rates of from about 275 to 2300 angstrom units per minute. However, a particularly useful rate is in the range from 300 to 800 angstrom units per minute, attained by adjusting the silane concentration in the input mixture. Typical film thicknesses achieved are about three-tenths micron but depositions up to one micron are readily made.

The dielectric constant, K, of the silicon dioxide, $SiO_2$, resulting from the deposition using $NO/SiH_4=100$ is 3.6. As the ratio decreases and the nitride content in the film increases the value of K becomes about 3.8 for the film made with $NO/SiH_4=3$, 850° C., indicating the complete suitability of the oxynitrides as electric insulating layers. Moreover, the herein described process is clean and dry in the chemical sense and safe at the concentrations described, and hence particularly suitable for use in combination with the epitaxial deposition of semiconductor materials.

For example, oxynitride films of this type may be applied during the fabrication of semiconductor devices, including integrated circuit devices, and selectively etched for use as diffusion masks. Further, such films may be left in place and reconstituted at the conclusion of diffusion and electrode deposition steps to provide a protective coating upon the completed device. In another well-known application, oxynitride films, as disclosed herein, combining dielectric strength and minimal stress, may form an insulating layer for the gate of an insulated gate field effect transistor. This type of majority carrier device likewise may be incorporated into semiconductor integrated circuit devices utilizing oxynitride films in accordance with this invention.

Although the invention has been described in terms of certain specific embodiments it will be understood that other arrangements may be devised by those skilled in the art which likewise fall within the scope and spirit of the invention.

What is claimed is:

1. A process for forming a silicon oxynitride film on a substrate comprising (a) mounting said substrate in a reaction chamber;

(b) heating said substrate to an elevated temperature; and (c) admitting a mixture consisting of nitric oxide and silicon hydride in a molar ratio respectively of between 1 and 100 to said chamber for a period of time sufficient to deposit a silicon oxynitride film on said substrate surface.

2. A process in accordance with claim 1 in which the substrate is silicon and said molar ratio is 3.

3. A process in accordance with claim 1 in which the substrate is silicon and said molar ratio is 20.

References Cited

UNITED STATES PATENTS

| | | | |
|---|---|---|---|
| 3,465,209 | 9/1969 | Denning et al. | 317—235UX |
| 3,460,007 | 8/1967 | Scott, Jr. | 317—235UX |
| 3,422,321 | 1/1969 | Tourbs | 117—Silicon nitride |
| 3,413,090 | 11/1968 | Krock et al. | 117—106X |
| 3,396,052 | 8/1968 | Rand | 117—106X |
| 3,385,729 | 5/1968 | Larchian | 117—106 |

OTHER REFERENCES

Brown, D. M., Gray, P. J., Hermann, F. K., Phillip H. R. and Taft, E. A.: "Properties of $Si_xO_yN_z$ Films on Si," in Solid State Science, Journal of the Electrochemical Society, pp. 311-317, March 1968.

ALFRED L. LEAVITT, Primary Examiner

A. GRIMALD, Assistant Examiner

U.S. Cl. X.R.

117—201; 317—235